United States Patent [19]

Kratzer et al.

[11] Patent Number: 4,503,395
[45] Date of Patent: Mar. 5, 1985

[54] METHOD AND CIRCUIT ARRANGEMENT FOR MEASURING A MAGNETIC FIELD

[75] Inventors: Wolfgang Kratzer; Peer Thilo, both of Munich, Fed. Rep. of Germany

[73] Assignee: Siemens Aktiengesellschaft, Berlin and Munich, Fed. Rep. of Germany

[21] Appl. No.: 379,997

[22] Filed: May 19, 1982

[30] Foreign Application Priority Data

May 27, 1981 [DE] Fed. Rep. of Germany ....... 3121234

[51] Int. Cl.³ .................. G01R 33/04; G01C 17/28
[52] U.S. Cl. ................................ 324/253; 324/99 D; 33/361
[58] Field of Search ............ 324/253, 254, 255, 99 D, 324/99 R, 111, 120; 33/361

[56] References Cited

U.S. PATENT DOCUMENTS

| | | |
|---|---|---|
| 3,605,011 | 9/1971 | Hart .................................. 324/253 |
| 4,290,018 | 9/1981 | Rhodes .............................. 324/255 |
| 4,300,095 | 11/1981 | Rhodes .............................. 324/255 |
| 4,305,035 | 12/1981 | Mach et al. ....................... 324/255 |

FOREIGN PATENT DOCUMENTS 1234848 2/1967 Fed. Rep. of Germany ...... 324/255

Primary Examiner—Gerard R. Strecker
Assistant Examiner—Warren S. Edmonds
Attorney, Agent, or Firm—Hill, Van Santen, Steadman & Simpson

[57] ABSTRACT

In order to measure a magnetic field, an exciting current rising in small increments is applied to a measuring probe so that the coil of the probe traverses the entire range from the negative saturation up to the positive saturation. At the secondary side, respective voltage pulses which decay according to an e-function are measured at the coil. The time constant of the voltage pulses corresponds to the respective coil inductance. Since the coil inductance is shifted relative to the zero point of the exciting current due to an external magnitude field, more voltage pulses with a high time constant are produced on one side of the zero point than on the other side. By means of digital counting of all voltage pulses whose time constant exceeds a minimum value both given a negative exciting voltage as well as given a positive exciting voltage, one obtains two measured values whose difference directly produces a measured value for a strength of the external magnetic field.

18 Claims, 14 Drawing Figures

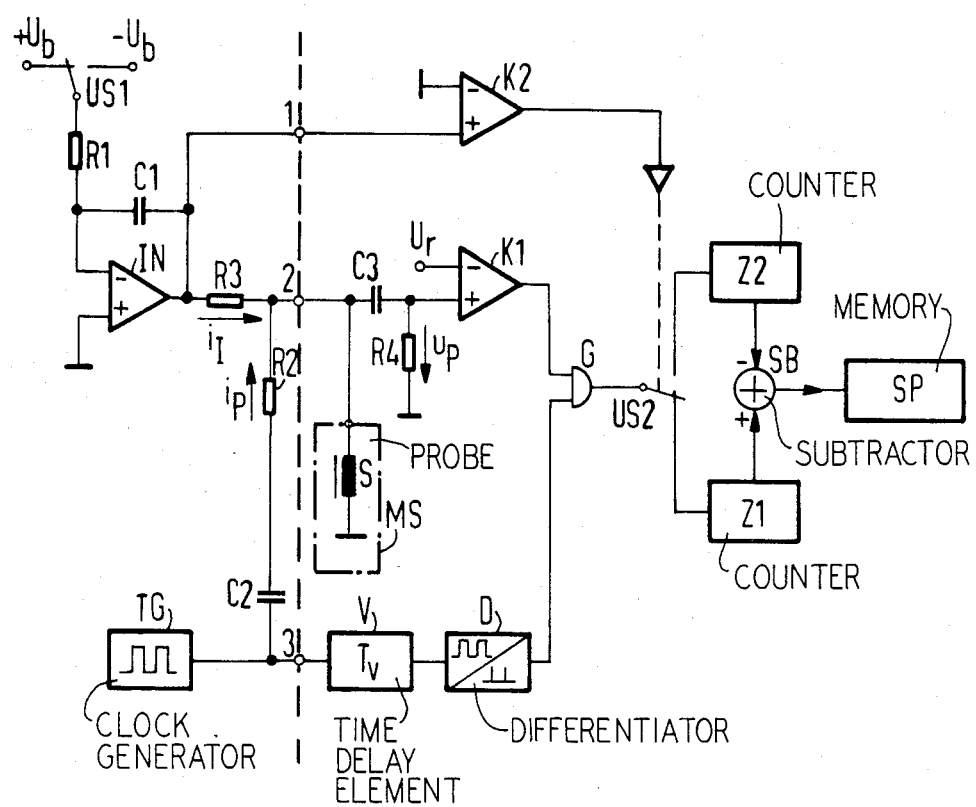

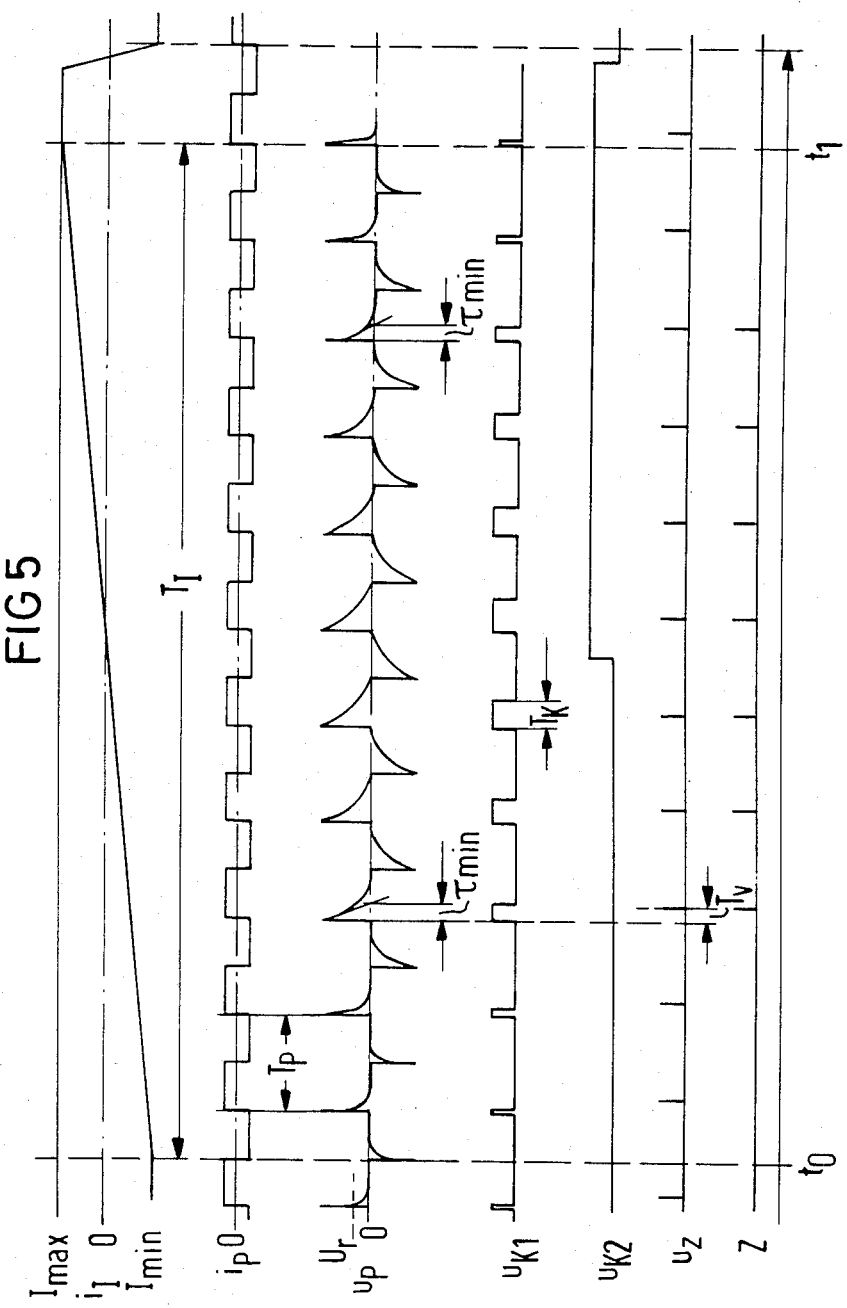

METHOD AND CIRCUIT ARRANGEMENT FOR MEASURING A MAGNETIC FIELD

BACKGROUND OF THE INVENTION

The invention relates to a method for measuring a magnetic field, particularly the earth's magnetic field, by means of a magnetic probe in the form of a coil with an iron core. A variable exciting current is applied to the coil having a magnitude such that the iron core achieves a positive and a negative saturation value. A change of the inductivity curve in comparison to a curve of the exciting current is determined by means of measuring the induced voltage at the coil. A strength of the external magnetic field in the direction of the axis of the probe is derived from this data. Also, the invention relates to a circuit arrangement for the implementation of this method.

Magnetic probes are particularly well suited for the precise determination of the relatively weak magnetic field of the earth. Given a known method for field determination by means of a magnetic probe (German patent application No. P 29 49 815, incorporated herein by reference), an alternating current is conducted through the winding of the probe which is so strong that the iron alternately achieves the positive and the negative saturation value. A voltage whose positive and negative half waves are of identical size (as long as no external magnetic field is influencing it) is then induced in a secondary winding. If, however, the external magnetic field of the earth is superimposed on the internal magnetic field of the probe, then the saturation will occur earlier or later depending upon the direction of the earth's magnetic field, and thus the induced secondary voltage will become asymmetrical. The differing amplitude of both half waves is a value from which the external field strength can be measured.

The method is based on the non-linearity of the iron. Therefore, the induced output voltage shows a significantly different curve shape than the input current. In particular, a large number of modulation or level-control dependent harmonics are generated which superimpose to form peak voltages of different size and thus vitiate the precise comparison of the two half-wave amplitudes. In order to keep this effect small, complicated and involved filters and amplifiers are necessary. A further problem of the known method is based on the fact that the generated signal is a voltage dependent on the field strength which must be generally digitized with an additional device for further processing.

SUMMARY OF THE INVENTION

An object of the invention is to specify a method for field measurement of the type initially cited which guarantees a high measuring precision given a low device cost, and which is, in particular, easy to manipulate and requires no involved balancing adjustment to the greatest extent possible.

Given the inventive method, this object is achieved in that an exciting current rising in steps discontinuously from a negative maximum value up to a positive maximum value is applied to the coil and the voltage pulses thereby induced at the coil which decay with different time constants in accordance with the momentary coil inductivity are measured. Counting pulses are formed from all voltage pulses whose time constants exceed a prescribed value. The respective plurality of counting pulses are compared to one another given negative and given positive exciting current. Finally, the strength of the external magnetic field is determined from the differential value.

The method according to the invention functions with an exciting current which increases from a negative maximum value up to a positive maximum value and allows the magnetic probe to traverse the entire range from the negative saturation up to the positive saturation. Since the exciting current, however, does not only change continuously but rather in many small discontinuities, correspondingly small voltage pulses are generated on the secondary side of the probe, said voltage pulses falling off with different time constants. This time constant is a measure for the coil inductivity and has its greatest value at the inductivity maximum which, given a coil without an external field, lies at the zero value of the exciting current.

Due to the external magnetic field at the coil, this inductivity maximum is shifted relative to the zero point of the exciting voltage and the value of the time constants in the individual secondary voltage pulses shifts accordingly. Thus, more voltage pulses with a high time constant appear on one side of the zero point of the exciting voltage than on the other side. Thus, the evaluation in the inventive method is reduced to a pulse measurement with a digital counter. This enumeration and differential formation directly produces a value for the external field strength; an additional analog-to-digital converter is not necessary. A further, significant advantage of this method also is that the respective operating point lies on the inductivity characteristic from the very outset so that probe-associated balancing techniques are eliminated. Thus, a plurality of probes can also be measured with one and the same evaluation circuit which, for example, can be connected in series through a multiplexer.

In an advantageous embodiment of the invention, the exciting current can be formed by means of superimposition of a linearly increasing current with a rectangular alternating current. For this purpose, a dc source with a following integrator can be employed, an alternating current generated by a clock generator being superimposed on its linearly increasing output current.

In another advantageous embodiment, the exciting current is generated by means of a voltage increasing in step-like fashion. Useful for this purpose is, for example, a digital-to-analog converter with a counter activated by a clock generator connected to its input.

For evaluation purposes, the measured voltage pulses are preferably converted into rectangular pulses with a pulse width proportional to the respective time constant and are respectively compared to a counting pulse delayed by a prescribed time in comparison to the rising edges of the exciting current. Accordingly, the respective counting pulse is only forwarded given simultaneous presence of both pulses. Therefore, all voltage pulses whose time constant lies below the prescribed value are eliminated. The comparison of the two pulses over a coincidence element is expediently followed by a difference-forming pulse counting means which can be changed over in accordance with the polarity of the exciting current. This counting means can contain two counters of which the one counts the pulses given a negative exciting voltage and the other counts the pulses given a positive exciting voltage. The difference can then be obtained in a following subtraction unit. Instead of two counters, a single counter can also be employed which counts forward given one polarity of the exciting voltage and counts back given the other polarity.

As is known, one can form an electronic compass which identifies direction relative to the earth's field lines, such an electronic compass being formed by two probes disposed at right angles relative to one another. The inventive method is particularly advantageous for this purpose since the evaluation circuit can be alternately connected to both probes so that only one circuit need be provided. As already mentioned above, the method according to the invention requires no probe-associated balancing. Via the evaluation means and the counting means forming the difference, each probe supplies a digital measured value which corresponds to a trigonometric function. The angle which the electronic compass assumes relative to the field lines of the earth can then be directly determined via a trigonometric function converter.

BRIEF DESCRIPTION OF THE DRAWINGS

FIG. 4 illustrates a circuit arrangement for implementing the inventive method;

FIG. 5 illustrates a time diagram for the current and voltage curves in the circuit according to FIG. 4;

DESCRIPTION OF THE PREFERRED EMBODIMENTS

Figure 1:
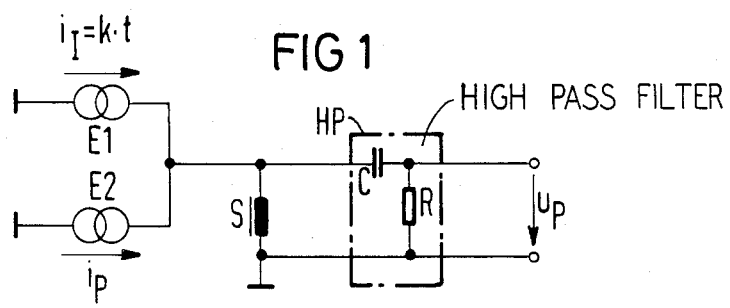
FIG. 1 illustrates a basic circuit diagram for implementing the measuring method according to the invention.

The basic circuit diagram of FIG. 1 shows a magnetic probe in the form of a coil S with the inductance $L_S$. Two current sources E1 and E2 whose currents are superimposed are connected to coil S. The current source E1 generates a current $i_f$ which rises uniformly with time t according to a constant k, i.e. $i_f = k \cdot t$. This current $i_f$ causes the coil S to traverse the entire range from negative up to positive saturation. A rectangular alternating current $i_P$ is superimposed on the current $i_f$ by the current source E2. By so doing, a voltage pulse sequence $u_P$ is generated in the coil S, being measured at the secondary side. Accordingly, a high pass filter HP with the resistor R and the capacitor C eliminates the dc component.

Figure 2A:
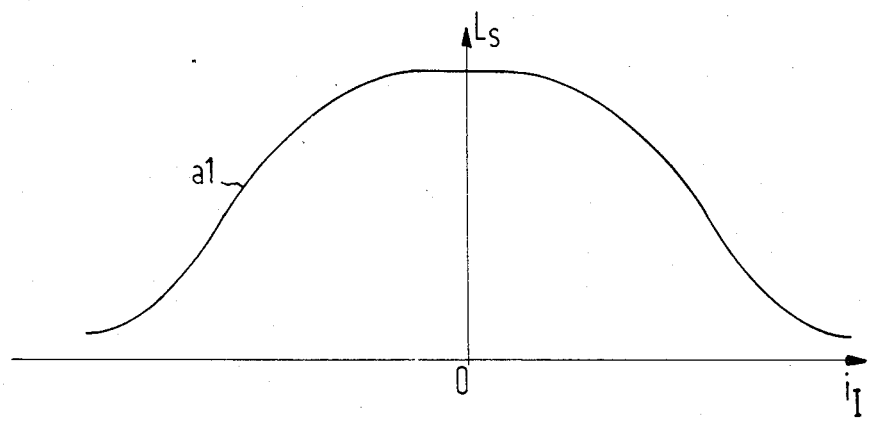
FIG. 2A illustrates a diagram with the curve of the coil inductivity and FIG. 2B illustrates a curve of the secondary voltage in a circuit according to FIG. 1 without an external magnetic field.
Figure 2B:
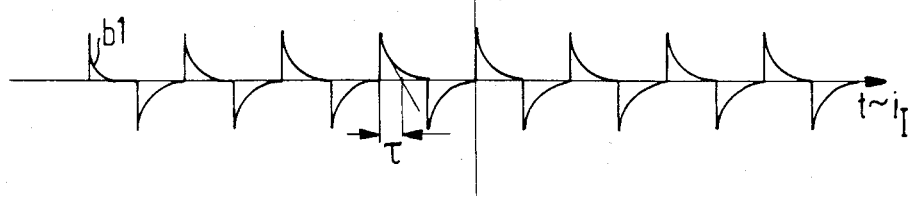

At curve a1, FIG. 2A shows the curve of the coil inductance $L_S$ as a function of the premagnetization current $i_f$. The coil induction has its maximum at $i_f=0$ and decreases given both greater positive as well as given greater negative currents. The curve b1 in FIG. 2B shows the variation of the secondary voltage $u_P$. This is a pulse sequence corresponding to the alternating current $i_P$. The voltage pulses drop off with a different time constant $\tau$ as a function of the coil induction $L_S$.

Figure 3A:
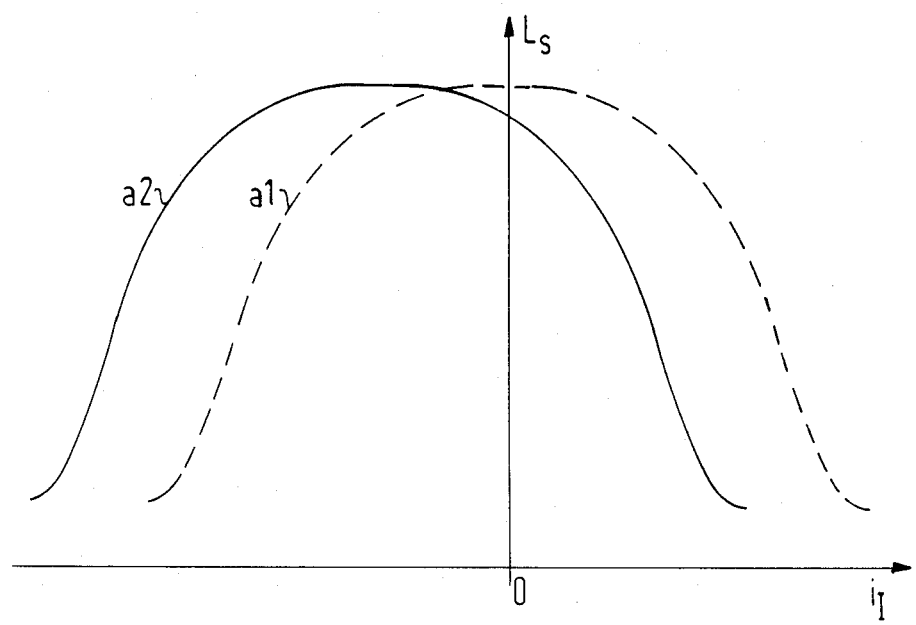
FIG. 3A illustrates a curve of the coil inductivity and FIG. 3B is a curve of secondary voltage with an external magnetic field.
Figure 3B:
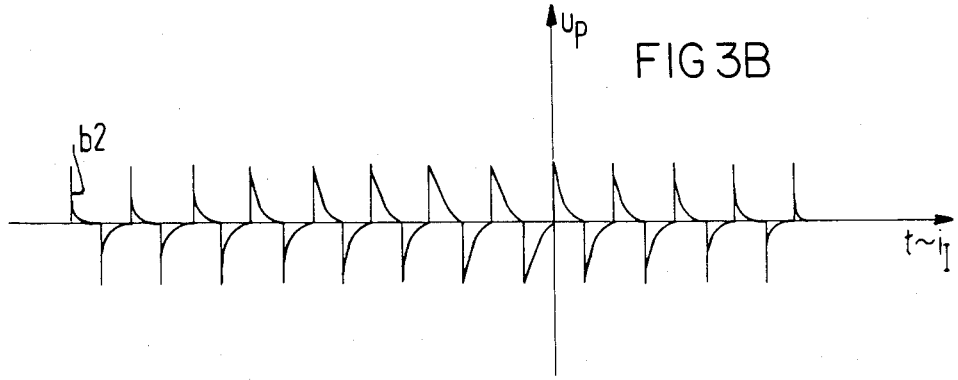

As long as no external magnetic field is effective, the pulse with the greatest time constant $\tau$ lies at the origin, i.e. at the zero point of the premagnetization current $i_f$. Depending upon its direction, the effect of every external magnetic field adds to or substracts from the premagnetization current $i_f$ and thus shifts the inductance curve relative to the origin. FIG. 3A shows a correspondingly shifted inductance curve a2 in comparison to the curve a1. The distribution of the voltage pulse sequence $u_P$ as shown in FIG. 3B is also shifted accordingly. In the illustrated example, the curve b2 has been shifted to the left side in comparison to the origin. The voltage pulse with the highest time constant lies at this side and accordingly, a larger plurality of voltage pulses with a high time constant $\tau$.

The described effect is utilized in a circuit arrangement according to FIG. 4 for field measurement. In order to generate the premagnetization current for the coil S of the magnetic probe MS, two dc voltages $+U_b$ and $-U_b$ are provided to which an integrator IN can be selectively connected. The integration duration is determined by the resistor R1 and the capacitor C1. The output of the integrator IN is connected via the resistor R3 to the coil S of the magnetic probe MS. Also, parallel thereto an impressed alternating current $i_P$ is supplied to the coil S from the clock generator TG via the capacitor C2 and the resistor R2. The voltage $u_P$ is coupled to an input of the comparator K1 via a high pass filter C3, R4. A reference voltage $U_r$ is present at the inverting input of comparator K1.

The comparator K1 is followed by a coincidence element G to whose second input the pulses of the clock generator TG are connected via a time delay element V and a differentiation element D. The output of the coincidence element G can be selectively connected via a changeover means US2 to the two counters Z1 or respectively Z2. The changeover means US2 is controlled by a comparator K2 which inspects the integration current of the integrator IN as to its polarity. As long as the integration current $i_f$ is negative, the coincidence element G is connected to the counter Z1; given a positive integration current, the corresponding connection is provided to counter Z2. A subtracter SB following the two counters Z1 and Z2 forms the difference of the counter readings which is input into a memory SP for further processing.

The functioning of the circuit of FIG. 4 can be seen from the time diagram of FIG. 5. Let it be assumed that the measurement is commenced at the point in time $t=t_o$. At this moment, the changeover means US1 is connected to the voltage $-U_b$. Beginning from this point in time, the output voltage $u_f$ rises linearly and thus so does the current $i_f$. The integration duration is indicated in FIG. 5 with $T_f$.

The alternating current $i_P$ superimposed by the clock generator TG has a symmetrical rectangular pulse shape and causes a voltage skip in the coil with each pulse edge, the voltage skip decaying according to an e-function with the time constant $\tau$. This time constant depends on the inductance $L_S$ of the coil S and on the resistance R4 according to the relationship $$\tau = L_S/R4$$

The pulse voltage $u_P$ is likewise illustrated in FIG. 5.

The pulse $u_P$ is converted into the pulse voltage $u_{K1}$ in the comparator K1 at whose inverting input the reference voltage $U_r$ is adjacent. The width $T_K$ is proportional to the time constant $\tau$ of the respectively corresponding voltage pulse $u_P$.

Given integration currents $i_I \approx I_{min}$ (negative maximum value) or, respectively $i_I \approx I_{max}$ (positive maximum value), the inductance of the probe is very small. A small time constant $\tau$ derives therefrom and, thus, so does a narrow pulse $u_{K1}$. The inductance is highest given the current $i_I = 0$, from which a voltage pulse $u_{K1}$ with the maximum width $T_K$ results.

A counting pulse sequence $u_Z$, which is delayed by the time $T_V$ in comparison to the positive edge of $i_P$, is derived from the pulse sequence $i_P$ of the clock generator TG by use of the time-delay element V with delay time $T_V$ and the differentiation element D. The signals $u_{K1}$ and $u_Z$, linked by the coincidence element G, produce the counting pulses Z for the two binary counters Z1 and Z2. When $T_K = k \cdot \tau > T_V$ applies, these counting pulses Z arise, where k forms a constant. By so doing, a minimum value $\tau_{min}$ is fixed. All pulses with a time constant $\tau \geq \tau_{min}$ are counted. As mentioned above, the changeover means US2 is controlled via the zero passage detector K2. The counting pulses Z arrive at the counter Z1 as long as the integration current $i_I$ is negative. Given a zero passage, they are then redirected to the counter Z2.

When no magnetic field influences the probe MS, the two counter readings of Z1 and Z2 are identical. When an external magnetic field exists, then it is superimposed on the internal magnetic field which is produced by the premagnetization current (integration current), and shifts the inductance curve toward the right or left in comparison to its origin. Different counter readings in Z1 and Z2 result. The difference of the counter contents corresponds to the strength of the external magnetic field. It is formed by means of a difference formation in the subtracter SB and is available at its output or in the memory SP for further processing.

Figure 9:
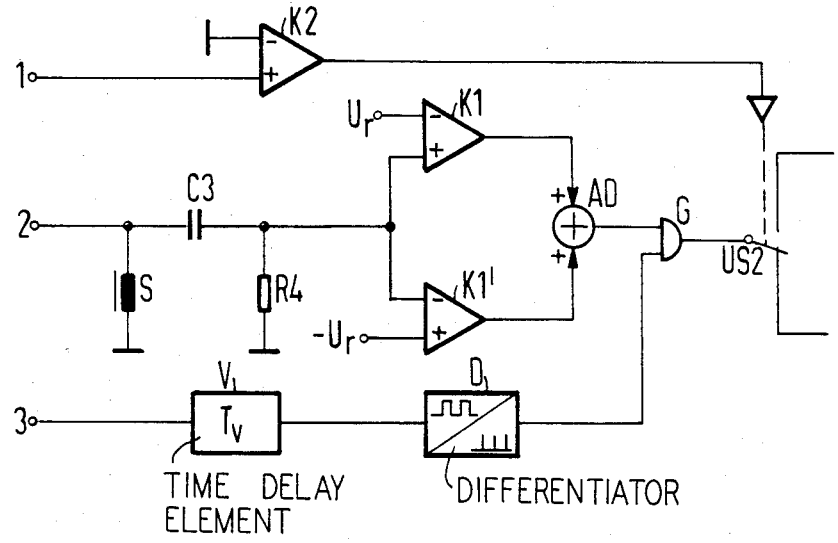
FIG. 9 illustrates a variation of the voltage measuring means in the circuit arrangement according to FIG. 4.

An advantageous variation of the circuit arrangement according to FIG. 4 is illustrated in FIG. 9. By means of adding a second comparator K1', it becomes possible to also evaluate the negative pulses of the voltage P, whereby a doubling of the counting pulses Z derives, this resulting in a clear improvement of the resolution or in an increase of the measuring speed.

Figure 6:
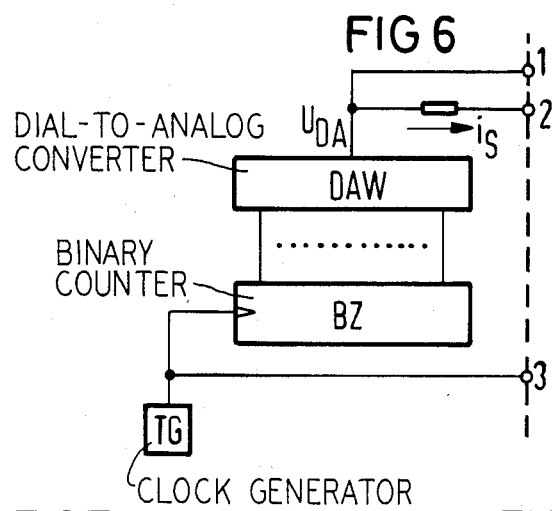
FIG. 6 illustrates a different embodiment of the exciting current feed in the circuit according to FIG. 4.
Figure 7A:
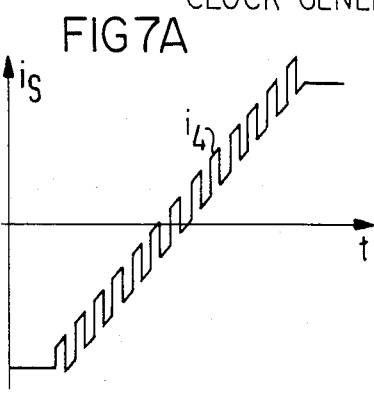
FIGS. 7A–7D illustrate diagrams for comparison of voltage pulses generated at different exciting currents.
Figure 7B:
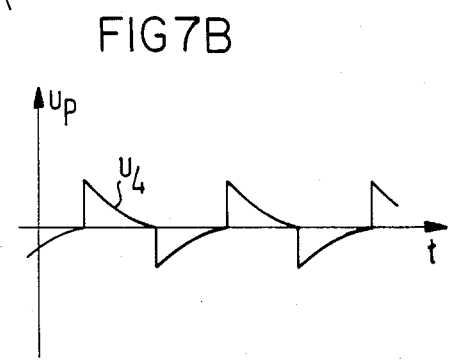
Figure 7C:
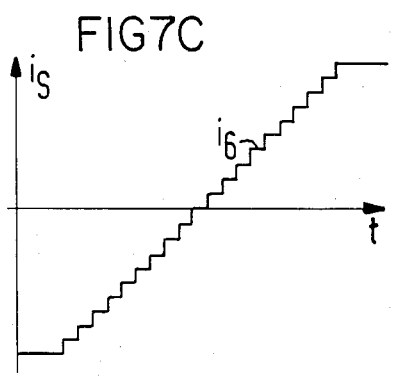
Figure 7D:
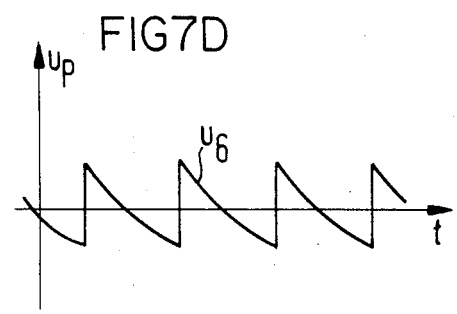

In an advantageous alternative embodiment of the invention, the integrator in the circuit according to FIG. 4 can be replaced by means of a digital-to-analog converter whose step-shaped output voltage simultaneously generates the current pulses. A corresponding arrangement is shown in FIG. 6. The digital-to-analog converter DAW is preceded by a binary counter BZ which is driven by the clock generator TG. The measurement commences when the binary counter BZ, beginning at 0, begins to count according to the clock signal of the clock generator TG. The binary output signal of the counter BZ is converted into a corresponding analog output voltage $u_{DA}$ in the digital-to-analog converter DAW. This output voltage $u_{DA}$ and thus the output current of this probe $i_S$ increases discontinuously with each counter increment. This discontinuous increase replaces the pulse current $i_P$ required in the integrator version. The arrangement according to FIG. 6 can be inserted into the circuit of FIG. 4 at the terminal points 1, 2, and 3 and can replace the integrator arrangement there.

A comparison of the different signal curves given the arrangements according to FIG. 4 and according to FIG. 6 is respectively illustrated in FIGS. 7A, 7B and 7C, 7D. There the respective curve of the probe current $i_S$ and the resultant pulse voltage $u_P$ at the probe is shown.

Given the embodiment with the integrator according to FIG. 4, the current $i_4$ increases in a meander-like fashion generating the pulse voltage $u_4$ with positive and negative pulse edges. Given the version with the digital-to-analog converter according to FIG. 6, a step-shaped current $i_6$ is generated which results in an essentially saw-tooth shaped pulse voltage $u_6$.

Figure 8:
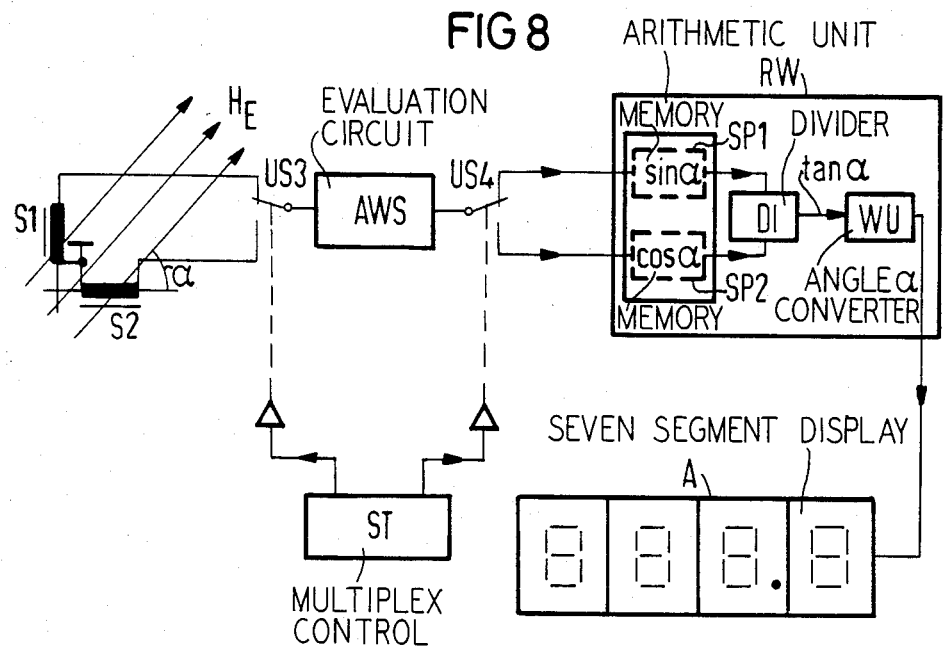
FIG. 8 illustrates a basic circuit diagram for an electronic compass which functions according to the inventive principle.

FIG. 8 shows a further development of the invention, namely, its employment in an electronic compass. It functions with two probes at right angles relative to one another with the coils S1 and S2 and can thus determine the angular direction $\alpha$ relative to the earth's magnetic field $H_E$.

The coils S1 and S2 are alternatively connected to the evaluation circuit AWS via the multiplex control ST with the changeover means US3. The evaluation circuit AWS corresponds, for example, to the circuit according to FIG. 4. At the same time, the changeover means US4 is co-actuated so that the measurement result with the coil S4 is input into the memory SP1 and the measurement result with the coil S2 is input into the memory SP2. Memories SP1 and SP2 have an arithmetic unit RW allocated to them, said arithmetic unit RW following the memories and exhibiting a divider DI and an angle converter WU.

The probe with the coil S1 measures the Y-component of the earth's magnetic field and the probe with the coil S2 measures the X-component.

$H_Y = H_{S1} = H_E \cdot \sin\alpha$ $H_X = H_{S2} = H_E \cdot \cos\alpha$ then apply.

The two measured values proportional to the sine and to the cosine of the angle $\alpha$ are then intermediately stored in the memories SP1 and SP2 and proceed from there to the divider DI at whose output a value proportional to the tangent of the angle is available. An arctangent formation then ensues in the trigonometric function converter WU, so that the angle $\alpha$ arises as a binary numerical value at the output of the arithmetic unit RW. It can be displayed in any desired form, for example, with a seven-segment display A.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method for measuring an external magnetic field, comprising the steps of: providing a magnetic probe in the form of a coil with an iron core; applying an exciting current to the coil which increases from a negative maximum value to a positive maximum value such that the iron core reaches both a positive and a negative saturation region and which causes an inductance of the coil to change depending upon the applied exciting current, the exciting current rising discontinuously in a large plurality of relatively small steps; measuring voltage pulses induced at the coil as a result of and corresponding to each of the steps of the applied exciting current, the voltage pulses decaying with a different time constant depending upon a momentary coil inductance at each step; forming counting pulses corresponding to all of the voltage pulses whose time constants exceed a prescribed value; comparing a respective plurality of the counting pulses corresponding to a negative exciting current with a respective plurality of the counting pulses corresponding to a positive exciting current; and determining a strength of the external magnetic field in a direction of an axis of the probe from a differential magnitude derived from the comparison which is indicative of a change in an inductance curve of the coil caused by the external magnetic field.

2. A method according to claim 1 wherein the exciting current is formed by superimposing a rectangular alternating current on a linearly increasing current.

3. A method according to claim 1 wherein the exciting current is generated by means of a voltage rising in step-like fashion.

4. A method according to claim 1 wherein the measured voltage pulses are converted into rectangular pulses with a pulse width proportional to the respective time constant and are respectively compared to a counting pulse time-delayed by a prescribed time relative to rising edges of the exciting current, and wherein the respective counting pulse is only forwarded given the simultaneous existence of both types of pulses.

5. A method according to claim 1 wherein a magnitude of the respective magnetic field is alternately measured in a direction of the coil axis at two magnetic probes which are perpendicular to one another, and wherein an angle of the probe arrangement in comparison to the field lines of the external field is determined from the two measured values.

6. A circuit arrangement for measuring an external magnetic field, comprising: a magnetic probe in the form of a coil with an iron core; means for applying an exciting current to the coil which increases from a negative maximum value to a positive maximum value such that the iron core reaches both a positive and a negative saturation region and which causes an inductance of the coil to change depending upon the applied exciting current, the exciting current rising discontinuously in a large plurality of relatively small steps; means for measuring voltage pulses induced at the coil as a result of and corresponding to each of the steps of the applied exciting current, the voltage pulses decaying with a different time constant depending upon a momentary coil inductance at each step; means for forming counting pulses corresponding to all of the voltage pulses whose time constants exceed a prescribed value; means for comparing a respective plurality of the counting pulses corresponding to a negative exciting current with a respective plurality of the counting pulses corresponding to a positive exciting current; and means for determining a strength of the external magnetic field in a direction of an axis of the probe from a differential magnitude derived from the comparison which is indicative of a change in an inductance curve of the coil caused by the external magnetic field.

7. A circuit arrangement according to claim 6 wherein the coil is connected to a current source whose exciting current output is varied by a current responsive to a clock generator; a voltage measuring means connecting to the coil for comparing the coil voltage pulses to a reference voltage, the output of said voltage measuring means being connected to a first input of a coincidence element; output signals of the clock generator being additionally supplied to a second input of the coincidence element through a time-delay element; and the coincidence element being followed by a difference-forming pulse counting means which is switchable in accordance with a polarity of the exciting current.

8. A current arrangement according to claim 7 wherein a high pass filter is connected between the coil and the voltage measuring means.

9. A circuit arrangement according to claim 7 wherein a comparator is provided as the voltage measuring means, a terminal of the coil being connected to a first of its inputs and a reference voltage being connected to a second of its inputs.

10. A circuit arrangement according to claim 7 wherein two comparators are provided as the voltage measuring means, a first input of each comparator being connected to a terminal of the coil and a positive reference voltage being connected to a second input of the first comparator and a negative reference voltage being connected to a second input of the second comparator.

11. A circuit arrangement according to claim 7 wherein a dc source with a following integrator is employed as the current source, and an alternating current generated by the clock generator is superimposed upon a linearly increasing output current of said dc source.

12. A circuit arrangement according to claim 7 wherein the counting means contains two counters whose inputs are alternately connected to the coincidence element and whose outputs are connected to a subtracter.

13. A circuit arrangement according to claim 7 wherein the current source is formed by a digital-to-analog converter to whose input is connected a binary counter activated by the clock generator.

14. A circuit arrangement according to claim 7 wherein the probe comprises two coils whose axes are perpendicular to one another; switch means for alternately connecting voltage pulses on the coils to the voltage measuring means; further switch means for switching an output of the voltage measuring means between two memories allocated to the two coils, said memories being incorporated in an arithmetic means for determination of an angle of the probe relative to the external magnetic field.

15. A circuit arrangement according to claim 14 wherein the arithmetic means has a divider as well as a trigonometric function converter.

16. A circuit arrangement according to claim 14 wherein the arithmetic means is followed by a display means.

17. A method for measuring an applied magnetic field, comprising the steps of: providing a magnetic probe in the form of a coil with a saturable core; applying a varying exciting current to the coil such that the core reaches both a positive saturation region and a negative saturation region, the exciting current rising in a plurality of relatively small steps from a negative maximum value up to a positive maximum value; determining a shift of an inductance curve of the coil from the negative to the positive saturation region as a result of the applied magnetic field by measuring voltage pulses induced at the coil as a result of and corresponding to each of the steps of the applied exciting current, the voltage pulses each decaying with a different time constant depending upon a momentary coil inductance which is a function of the applied exciting current and applied external field; forming counting pulses corresponding to all voltage pulses whose time constants exceed a prescribed value and separately counting the pulses for the condition when the exciting current is negative and for when the exciting current is positive and comparing the two counts; and determining a differential between the two counts which is indicative of a strength of the external magnetic field influencing the magnetic probe as a result of said shift of the inductance curve.

18. An arrangement for measuring an applied magnetic field, comprising: a magnetic probe in the form of a coil with a saturable core; means for applying a varying exciting current to the coil such that the core reaches both a positive saturation region and a negative saturation region and which causes an inductance of the coil to change, the exciting current rising in a plurality of relatively small steps from a negative maximum value up to a positive maximum value; means for determining a shift of an inductance curve of the coil by measuring pulses induced at the coil from the negative to the positive saturation regions as a result of and corresponding to each of the small steps of the applied exciting current, the voltage pulses decaying with a different time constant depending upon momentary coil inductance at a time when each of the steps occurs; means for forming counting pulses from all voltage pulses whose time constants exceed prescribed value and separately counting the pulses depending upon whether the exciting current is negative or positive; and means for determining an influence of the external magnetic field on the probe which causes the shift of the inductance curve by a differential comparison of the respective counts corresponding to the negative and positive exciting current.

* * * * *